United States Patent [19]

Matsuyama

[11] Patent Number: 5,067,664
[45] Date of Patent: Nov. 26, 1991

[54] PHOTOSENSITIVE SHEET POSITIONING DEVICE

[75] Inventor: Kazuhiro Matsuyama, Ikoma, Japan

[73] Assignee: Sharp Kabushiki Kaisha, Osaka, Japan

[21] Appl. No.: 489,490

[22] Filed: Mar. 7, 1990

[30] Foreign Application Priority Data

Mar. 7, 1989 [JP] Japan .................................. 1-25637

[51] Int. Cl.⁵ .......................................... B65H 16/00
[52] U.S. Cl. ..................................... 242/67.2; 226/15; 226/76
[58] Field of Search ............ 242/67.2, 67.1 R, 67.3 R; 226/94, 15, 74, 76, 86; 33/623; 355/72; 346/136; 271/232

[56] References Cited

U.S. PATENT DOCUMENTS

| | | | |
|---|---|---|---|
| 3,381,554 | 5/1968 | Ploch et al. | 33/623 X |
| 3,974,582 | 8/1976 | Jantzen, Jr. | 33/623 X |
| 4,805,316 | 2/1989 | Curti | 33/623 X |

FOREIGN PATENT DOCUMENTS

| | | | |
|---|---|---|---|
| 0189386 | 10/1984 | Japan | 355/72 |
| 0014249 | 1/1985 | Japan | 355/72 |

*Primary Examiner*—Daniel P. Stodola
*Assistant Examiner*—John P. Darling
*Attorney, Agent, or Firm*—Birch, Stewart, Kolasch & Birch

[57] ABSTRACT

A photosensitive sheet positioning device used in an image forming apparatus provided with a photosensitive sheet wound in a roll, a leader sheet attached to the forefront edge of the photosensitive sheet, forwarding holes formed in a line on the sides of the leader sheet, and forwarding pins mounted and protruding on the outer circumference of a roller, whereon the forwarding holes are successively fitted, and that control the forwarding direction of the photosensitive sheet, comprises fastening holes formed on the forefront portion of the leader sheet, and fastening pins that restrain the motion of the leader sheet and that may be inserted in and removed from the fastening holes freely. Accordingly, in the present device, the forwarding holes may be fitted on the forwarding pins easily, rapidly and without being fitted in a shifted manner.

6 Claims, 12 Drawing Sheets

PHOTOSENSITIVE SHEET POSITIONING DEVICE

FIELD OF THE INVENTION

The present invention relates to a device for positioning a photosensitive sheet used in an image forming apparatus such as a copying machine, a laser printer or other apparatus, during the initial loading operation.

BACKGROUND OF THE INVENTION

Among the apparatuses using a photosensitive sheet, there are known the copying machine of the electrostatic image transfer type, the laser printer, the full color printer, etc. The copying operation of a copying machine of the electrostatic image transfer type, which is widely used in a copying machine, will be described.

A copy paper is fed into the main body of the copying machine from paper feeding cassettes or the like, waits so as to be in synchronization with the photosensitive sheet mounted for example in a belt shape, and is then caught in with and comes in contact with the aforementioned photosensitive sheet that is in a rotating state. The toner image of the sheet is then transferred on to the copy paper, the fixing process of the toner is further performed through heat and other method, and the copy paper is discharged outside the main body of the copying machine thereafter. As to the photoconductor belt that completed the transfer operation on to the copy paper, it goes through the stages of cleaning for removing the remaining toner, static elimination, electrostatic charge, exposure and developing, and transfers the newly formed toner image on to the copy paper thereafter.

However, there also exists an image forming apparatus operating according to a principle different from the reproduction of the electrostatic image transfer type. In this copying machine that is one type of image forming apparatus, a photosensitive sheet 2 stored in a roll shape is sent forward on and an image is formed on a copy paper 25 by pressing the photosensitive sheet 2 and the copy paper 25 together, as illustrated in FIG. 10. Namely, the photosensitive sheet 2 is made of a photosensitive and pressure sensitive material, and a multiplicity of microcapsules having a diameter of about 10 to 20 $\mu$m containing leuco ink and light hardenable substance, are coated on a light reflective metallic sheet of aluminum (A1) or other metal. As to the aforementioned copy paper 25, it is coated with a developer that colors in reaction with leuco ink.

A copying machine such as described above, is provided on its top with an original document platen 3 composed of a hard transparent glass. Below the original document platen 3 there is installed a first optical unit 6 capable of moving in the directions A and B, composed of light sources 4 that irradiate light toward an original document placed on the original document platen 3, and a reflection mirror 5 that leads the reflected light from the original document to a reflection mirror 7.

A second optical unit 9 is composed by the above-mentioned reflection mirror 7 and a reflection mirror 8 placed in a diagonal direction opposite to the direction of the reflection mirror 7. Provision is made so that in the second optical unit 9, the aforementioned reflected light is led toward a lens 10. The aforementioned reflected light passes through the lens 10, is reflected thereafter by a reflection mirror 11, and is irradiated on the photosensitive sheet 2 described earlier.

The photosensitive sheet 2 is supported by a feed shaft 13 located inside a cartridge 12 so as to be capable of rotating freely. An edge of the photosensitive sheet 2 passes successively on guide rollers 14 and 15 located inside the cartridge 12, a tractor roller 16, an exposure plate 20, a buffer roller 17 mounted so as to be able to move in the directions C and D, and between pressure rollers 18a and 18b of a pressure development device 18, and is then wound on a winding roller 19 installed inside the cartridge 12.

Moreover a leader sheet is attached to the forefront portion of an edge of the photosensitive sheet 2. When starting to send the photosensitive sheet 2 forward, the photosensitive sheet 2 may be prevented from slipping off from the proper forwarding direction by fitting forwarding holes formed in a line on both sides of the leader sheet, on forwarding pins 16a mounted and protruding on the circumference of the tractor roller 16 mentioned earlier.

The transportation system of the copy paper 25, from the feeding to the discharge, will be described. Sheets of copy paper 25 are piled up in paper feeding cassettes 21, 2 and 23. The top copy paper sheets 25 of the paper feeding cassettes 21, 22 and 23, are fed into the copying machine 1 by feeding rollers 26, 27 and 28 respectively. The copy paper 25 that was fed into the copying machine 1 goes through a paper stop roller 29, that synchronizes the copy paper 25 with the photosensitive sheet 2, passes between the aforementioned pressure rollers 18a and 18b, then reaches a glossing device 30 provided with a heat roller 30a, and after the developer is fixed in the glossing device 30, is discharged on a paper discharge tray 32 by a paper discharge roller 31.

The exposure driving system of the copying machine 1 outlined above, will be described. The buffer roller 17 is moved at a prescribed speed in the direction D, while the pressure development device 18 is kept in a suspension state and the feed shaft 13 is ready to rotate. The prescribed speed at this time, is determined according to the copy magnification and the original document scanning speed, that is the travel speed of the first optical unit 6. In concrete terms, when the copy magnification is set at full size and the original document scanning speed is $V_1$, the buffer roller 17 is moved in the direction D at a speed $\frac{1}{2} V_1$ so that the transportation speed of the photosensitive sheet 2 on the exposure plate 20 equals $V_1$.

After the exposure operation described above is completed, the buffer roller 17 stops moving, then the feed shaft is locked so that it does not rotate any more, and the pressure development device 18 starts rotating. Accordingly, the photosensitive sheet 2 whereon a latent image was formed through the aforementioned exposure operation, is conveyed by the pressure development device 18. At this time the buffer roller 17 is pulled by the photosensitive sheet 2 and moves in the direction C. Meanwhile, the copy paper 25 that was sent by the feeding roller 26 and the like during the feeding operation of the copy paper 25, is synchronized with the photosensitive sheet 2 whereon the latent image is formed, at the paper stop roller 29 and is conveyed. The copy paper 25 is then superposed with the photosensitive sheet 2 in the pressure development device 18, and an image is formed on the copy paper 25. In the image forming process, the microcapsules of the photosensitive sheet 2 that did not harden yet and that are distributed in correspondence with the latent image, are broken by the pressure rollers 18a and 18b, the leuco ink that was contained therein flows out to react with the developer on the copy paper 25 to develop colors, thus forming the image.

The copy paper 25 that passed through the image forming process, then proceeds to the glossing device 30. After the image fixing operation is performed in the glossing device 30 by boosting the coloring and making the resin previously coated on the copy paper 25 even, the copy paper 25 then moves on to the discharge process, and is discharged on the paper discharge tray 32 by the paper discharge roller 31.

However, as described earlier, a leader sheet is attached at the forefront portion of an edge of the photosensitive sheet 2, and when starting to send the photosensitive 2 sheet forward, the photosensitive sheet 2 is prevented from slipping off from the proper forwarding direction by fitting successively the forwarding holes formed in a line on both sides of the leader sheet, on the forwarding pins 16a of the tractor roller 16.

Nevertheless, the copying machine presents the disadvantage that fitting the forwarding holes on the above-mentioned forwarding pins 16a is not easy, as the leader sheet is of a firm texture, thus the initial loading operation cannot be performed quickly. Also, the forwarding holes sometimes happen to be fitted in a shifted manner, causing the photosensitive sheet 2 to be sent slantwise, or further, one side of the photosensitive sheet 2 to loosen, or the like.

SUMMARY OF THE INVENTION

An object of the present invention is to provide a photosensitive sheet positioning device that enables forwarding holes to be fitted easily and quickly on forwarding pins during the initial loading operation of a photosensitive sheet.

Another object of the present invention is to provide the photosensitive sheet positioning device capable of preventing the photosensitive sheet from being sent slantwise, and of preventing one side of the photosensitive sheet from loosening.

In order to achieve the above-mentioned objects, a photosensitive sheet positioning device in accordance with the present invention, for use in an image forming apparatus provided with a photosensitive sheet wound in a roll, a leader sheet attached on one edge of the photosensitive sheet, forwarding holes formed in a line on the sides of the leader sheet, forwarding pins mounted and protruding on the outer circumference of a roller, whereon the aforementioned forwarding holes are fitted successively, and that controls the forwarding direction of the aforementioned photosensitive sheet, is characterized in comprising fastening holes formed on the forefront edge of the leader sheet, and fastening pins that restrain the motion of the aforementioned leader sheet, installed so as to be freely inserted in and removed from the aforementioned fastening holes.

In the aforementioned arrangement, when the fastening pins are inserted in the fastening holes, the motion of the leader sheet is restrained. The forwarding holes may be thus, fitted easily and rapidly on the forwarding pins thereafter, and prevented from being fitted on the forwarding pins in a shifted manner. As a result, the difficulty due to a slantwise transport of the photosensitive sheet, the loosening of one side of the photosensitive sheet, or other trouble may be overcome.

Moreover, after the positioning of the photosensitive sheet is accurately performed, the transport of the leader sheet and the photosensitive sheet may be carried out by removing the fastening pins from the fastening holes.

For a fuller understanding of the nature and advantages of the invention, reference should be made to the ensuing description taken in conjunction with the accompanying drawings.

BRIEF DESCRIPTION OF THE DRAWINGS

FIG. 1 is a perspective view illustrating a situation where a bucket whereon a positioning device is mounted is pulled out from a copying machine.

FIG. 2 is a schematic front view illustrating the internal configuration of the copying machine.

FIG. 3(b) is a vertical cross-sectional view illustrating the internal structure of the positioning device when the fastening pins are in a protruding state.

FIG. 4 is a perspective view illustrating a situation where a cartridge is loaded in the bucket.

FIG. 5 is a perspective view illustrating the state of a leader sheet when it is set initially.

FIG. 6 to FIG. 9 illustrate another embodiment of the present invention.

FIG. 6 is a perspective view illustrating a situation where the bucket whereon the positioning device is mounted, is pulled out from the copying machine.

FIG. 8 is a perspective view illustrating a situation where a cartridge is loaded in the bucket.

FIG. 9 is a perspective view illustrating the state of a leader sheet when it is set initially.

DETAILED DESCRIPTION OF THE EMBODIMENTS

An embodiment of the present invention will be described with reference to FIG. 1 to FIG. 5. For the sake of clarity, the members having the same functions than the ones used in the conventional example outlined above, will be designated with the same code and their detailed description will be omitted.

Figure 2:
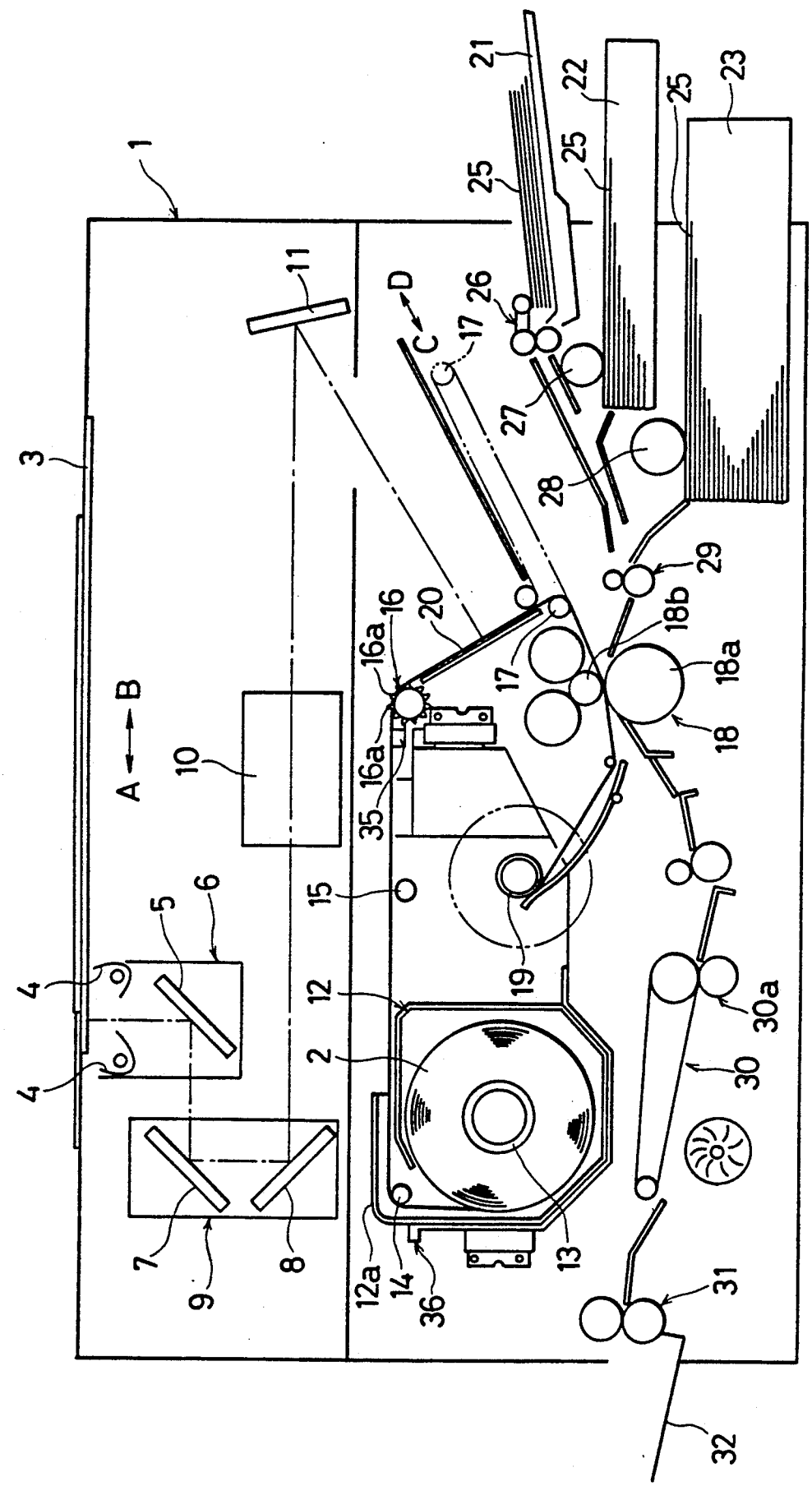

As illustrated in FIG. 2, a positioning device in accordance with the present invention, is mounted in the vicinity of a tractor roller 16, on a bucket 36 that is loaded inside a copying machine 1 and houses a cartridge 12. The cartridge 12 is composed by a shade 12a that shields the light from a photosensitive sheet 2, a feed shaft 13, guide rollers 14 and 15, and a winding roller 19, and mounted so as to be freely installed in and removed from the bucket 36.

Figure 1:
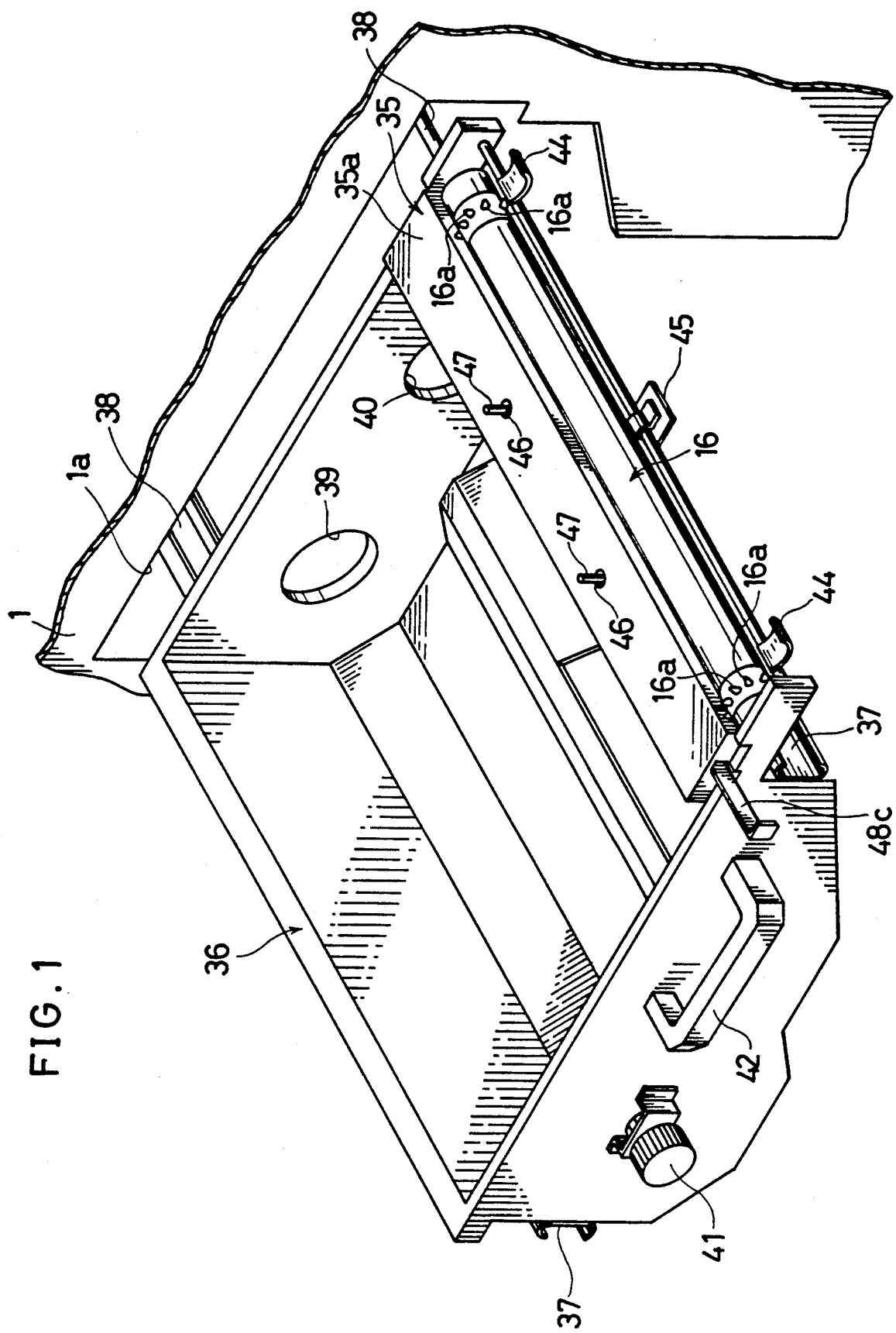
FIG. 1 to FIG. 5 illustrate an embodiment of the present invention.

As shown in FIG. 1, the bucket 36 is arranged so that it may be drawn out through an aperture section 1a formed on the front wall of the copying machine 1. On both sides of the bucket 36 there are fixed rails 37 which are set in rail engagement members 38 mounted inside the copying machine 1 and enabling the bucket 36 mentioned earlier to slide smoothly when it is drawn out. Through holes 39 and 40 for connecting the feed shaft 13 and the winding roller 19 mentioned earlier to their respective driving sections (not shown), are formed on the rear wall of the bucket 36. On the front wall of the bucket 36, there are installed a knob 41 that the operator uses to rotate the aforementioned feed shaft 13 when necessary, and a handle 42 for drawing the bucket 36 out.

In the vicinity of the tractor roller 16 and on the winding side of the photosensitive sheet 2, there is supported a support rod 43 capable of pivoting freely. On both sides of the support rod 43 are mounted guide members 44 for holding down both sides of the photosensitive sheet 2 and guiding it. An operating segment 45 is attached to the central portion of the support rod 43. By rotating and bringing down the operating segment 45 on the tractor roller 16 side, the support rod 43 rotates and the guide members 44 mentioned earlier are brought down on the tractor roller 16 side.

In the vicinity of the tractor roller 16 and on the photosensitive sheet 2 feeding side, there is mounted the positioning device 35 of the present invention. Two holes 46 wherethrough fastening pins 47 emerge and immerge, are formed at a prescribed distance in the longitudinal direction of the aforementioned tractor roller 16 in the central portion on the surface of a basket portion 35a of the positioning device 35.

Figure 3A:
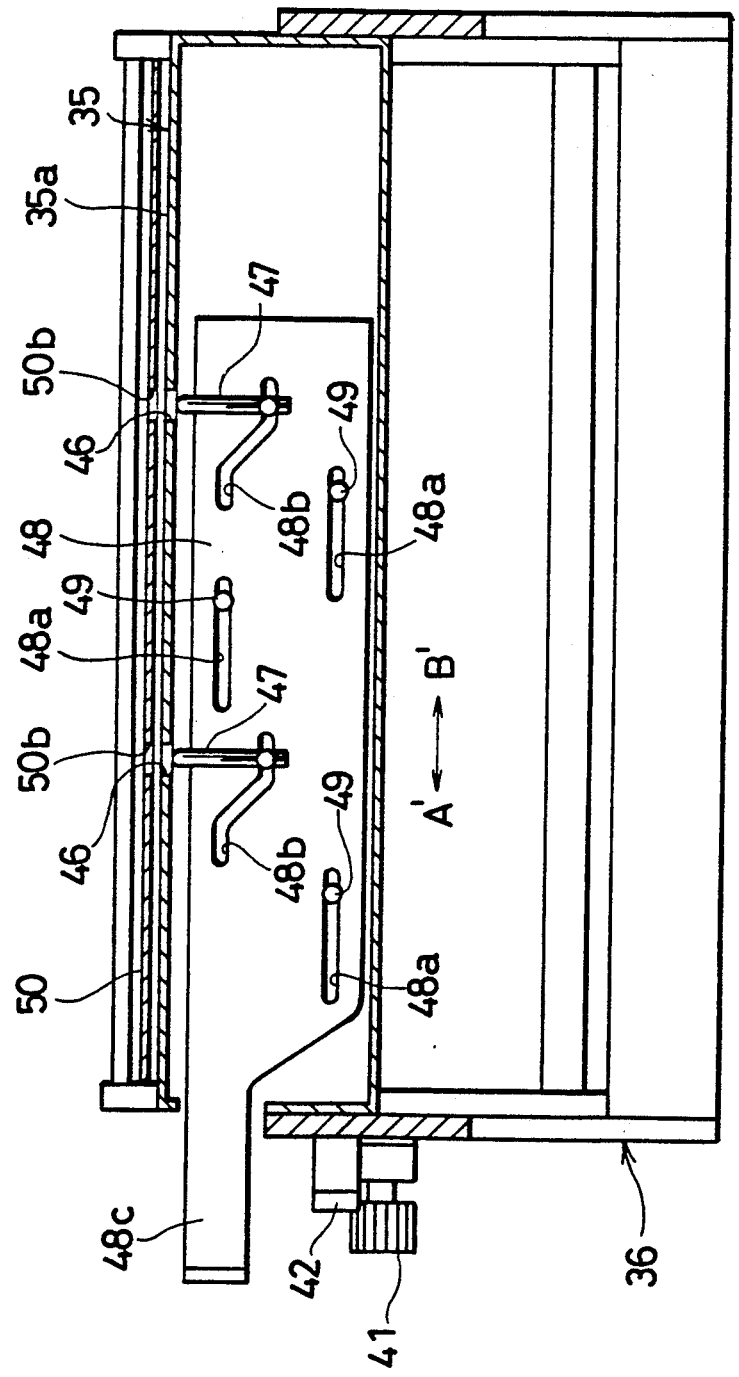
FIG. 3(a) is a vertical cross-sectional view illustrating the internal structure of the positioning device when fastening pins are in an immerged state.
Figure 3:
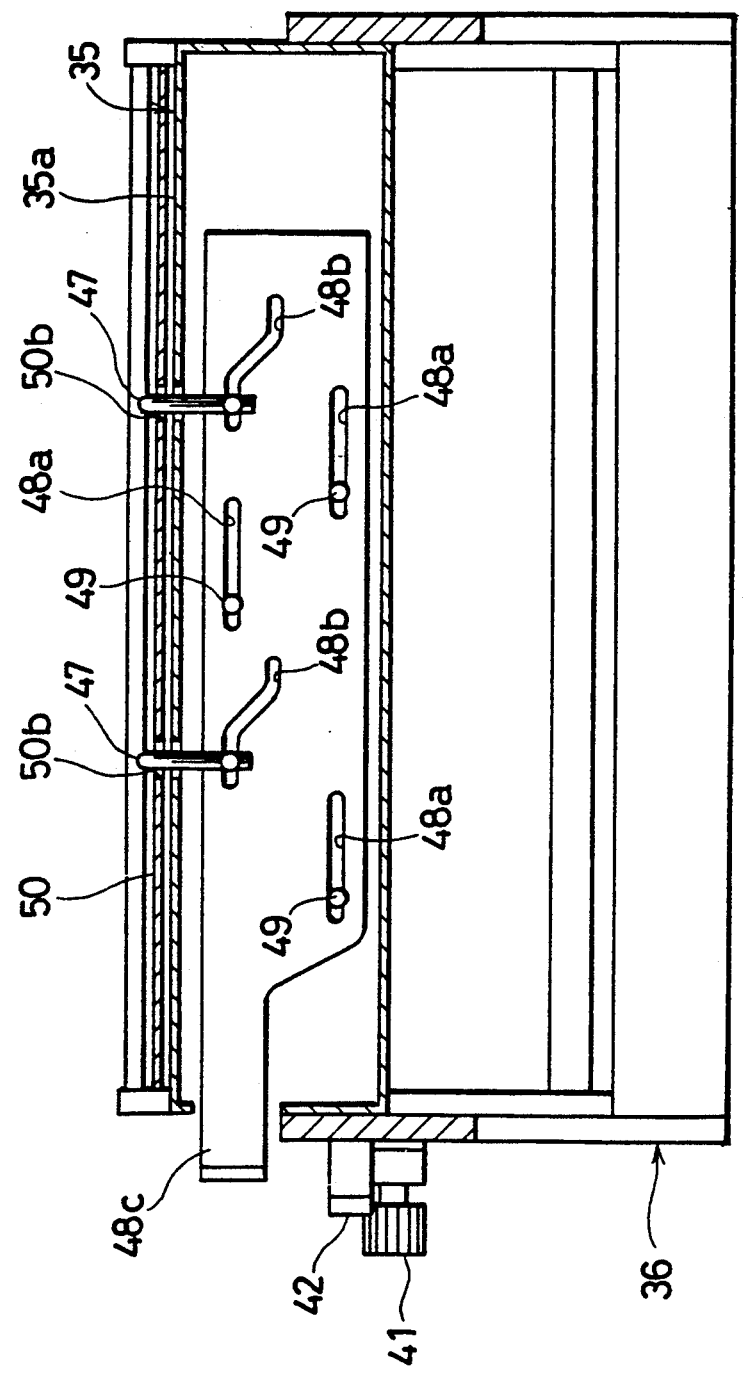

A slide plate 48 capable of moving freely in the directions A' and B' is mounted inside the basket portion 35a, as illustrated in FIG. 3(a). On the front edge of the slide plate 48, a handle 48c formed somewhat narrower is provided so as to penetrate the front wall of the basket portion 35a, and serves as a handle to be used when the operator operates the slide plate 48. Guide slits 48a are formed on the main body of the slide plate 48, and guide protrusions 49 respectively engaged in the aforementioned guide slits 48a are formed on the internal wall of the basket portion 35a. The motion direction of the slide plate 48 is restricted to the directions A' and B' by means of the guide protrusions 49 and the guide slits 48a. On the slide plate 48 are formed bent guide slits 48b in the shape of, in order from the front side of the slide plate 48 on, an upper horizontal portion, a declining oblique portion and a lower horizontal portion. To each of these bent guide slits 48b is connected each rear edge of the aforementioned fastening pins 47, the fastening pins 47 being supported so as to be able to move up and down only.

When the slide plate 48 is drawn out in the front direction, the fastening pins 47 are positioned at the lower horizontal portion of the above-mentioned bent guide slits 48. Accordingly, while the fastening pins 47 plunge into the basket portion 35a when the slide plate 48 is being drawn out in the front direction, provision is made so that the fastening pins 47 thrust forward from the surface of the basket portion 35a when the slide plate 48 is being pushed inside, as illustrated in FIG. 3(b).

Figure 4:
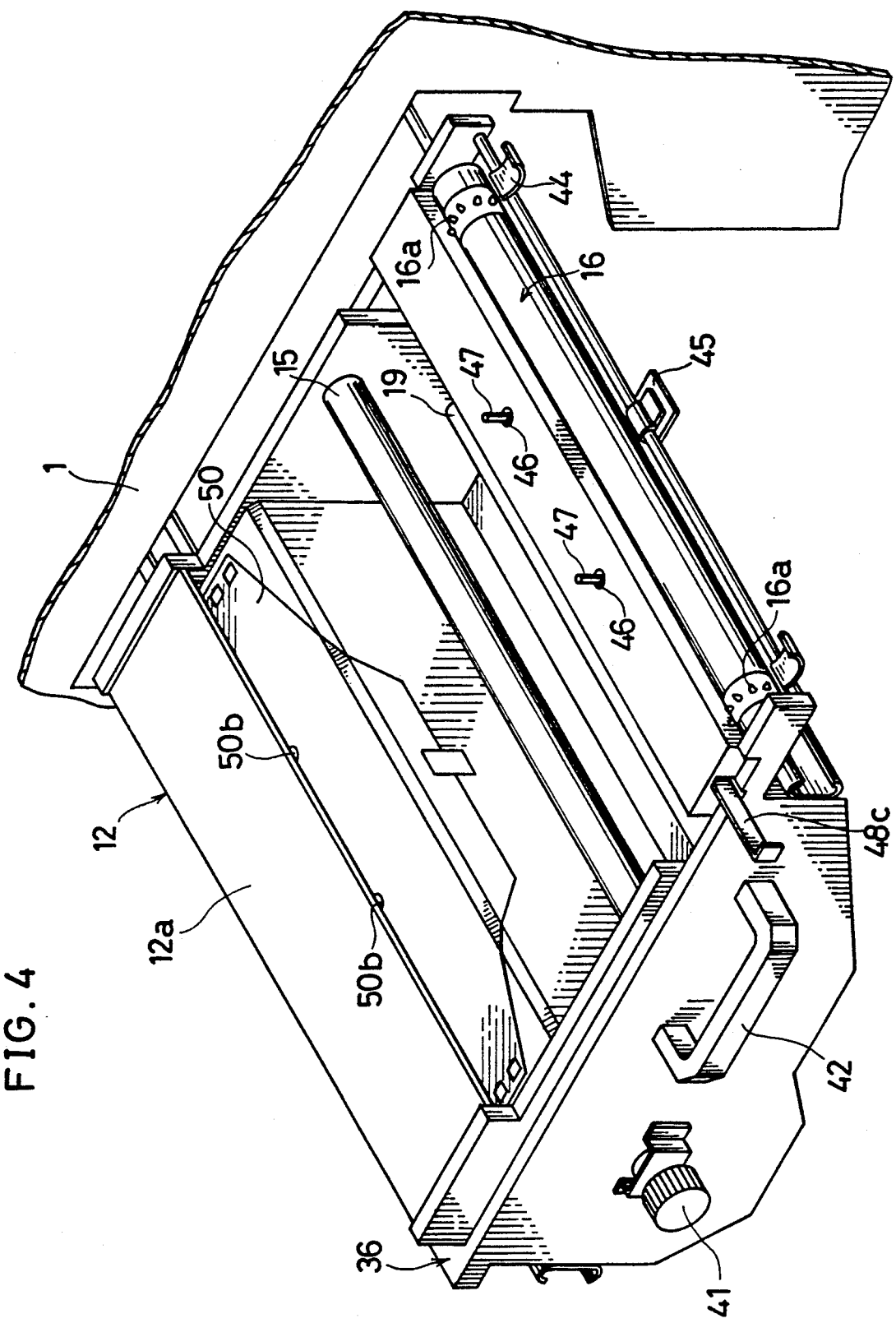
Figure 5:
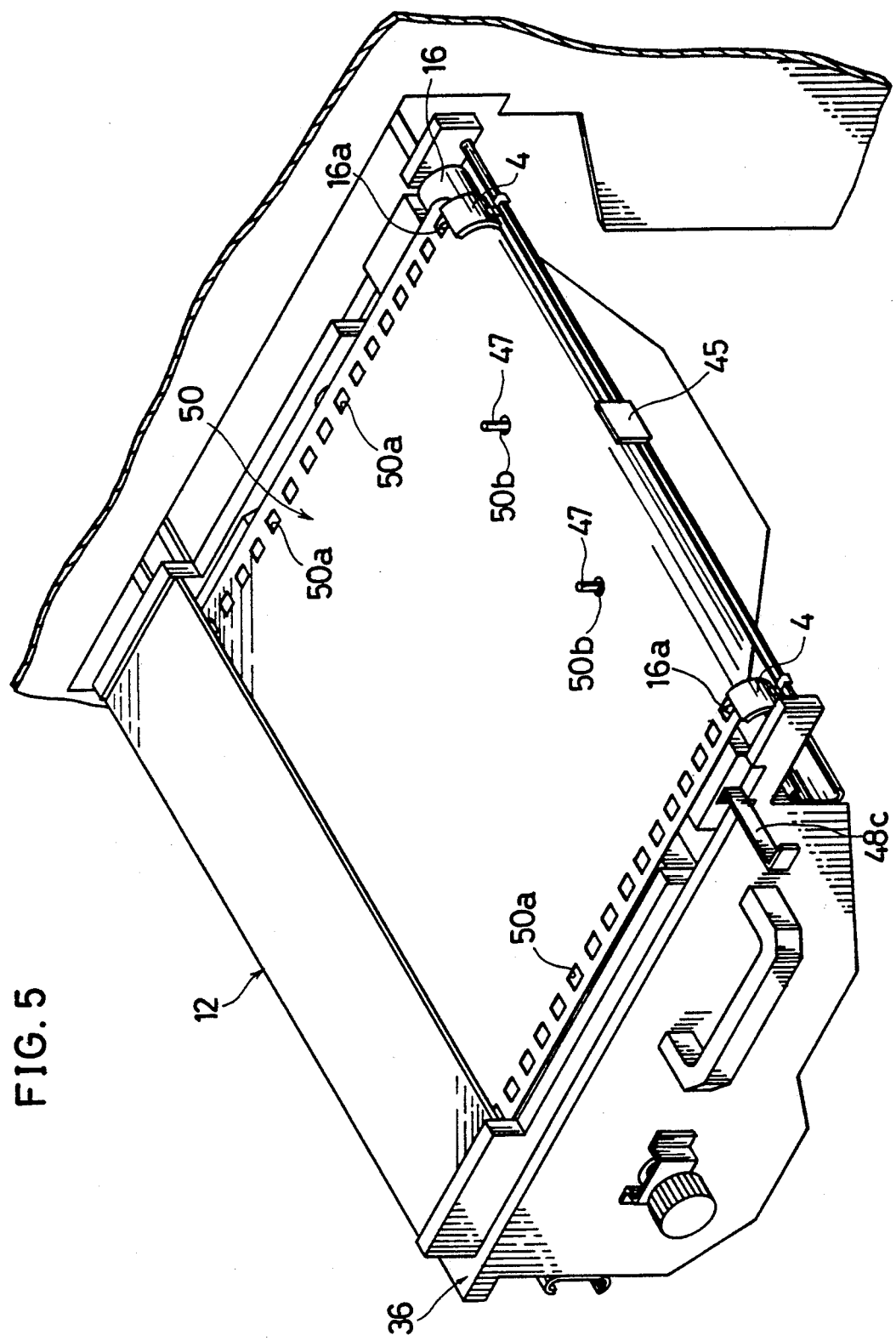

In the arrangement described above, when installing the photosensitive sheet 2 in the copying machine 1, the operator draws the bucket 36 out of the copying machine 1, as illustrated in FIG. 4, and then installs the photosensitive sheet 2 stored in the cartridge 12 in the bucket 36. At this stage, the operator pushes the slide plate 48 inside and makes the fastening pins 47 thrust upward to a protruding state. Then, the operator rotates the feed shaft 13 with the knob 41 and pulls out a leader sheet 50 attached to the forefront portion of the photosensitive sheet 2. The leader sheet 50 used here, like a conventional one, has forwarding holes 50a of a uniform pitch formed in a line on its both sides, and in addition has fastening holes 50b formed at prescribed spots on the forefront portion of the leader sheet 50, and spaced in the same manner as the fastening pins 47 mentioned above. Accordingly, when winding the leader sheet 50 that was pulled out around the tractor roller 16 mentioned earlier, the operator inserts the fastening pins 47 which are in a protruding state, into the fastening holes 50b, and then fits the forwarding holes 50a on the forwarding pins 16a of the tractor roller 16, as illustrated in FIG. 5.

Hence, when the protruding fastening pins 47 are inserted in the fastening holes 50b, the motion back and forth, left and right of the leader sheet 50 is restrained, and the connection of the forwarding pins 16a to the forwarding holes 50a performed thereafter, may be carried out easily and quickly. Also, the forwarding holes 50a are prevented from being fitted on the forwarding pins 16a in a shifted manner, and the difficulties such as the slantwise transport, the loosening of one side of the photosensitive sheet 2, or the like may be overcome.

After having wound the leader sheet 50 around the tractor roller 16, the operator rotates and brings down the operating segment 45 causing the guide members 44 to come in contact with the leader sheet 2, makes the fastening pins 47 plunge inside the basket portion 35a by pulling the handle 48c, and removes the fastening pins 47 from the fastening holes 50b. As a result, the subsequent transport of the leader sheet 50 and the photosensitive sheet 2 may be performed.

Another embodiment of the present invention will be described with reference to FIG. 6 to FIG. 9. The members having the same structure than in the aforementioned embodiment, will be designated by the same code and their description will be omitted.

Figure 7A:
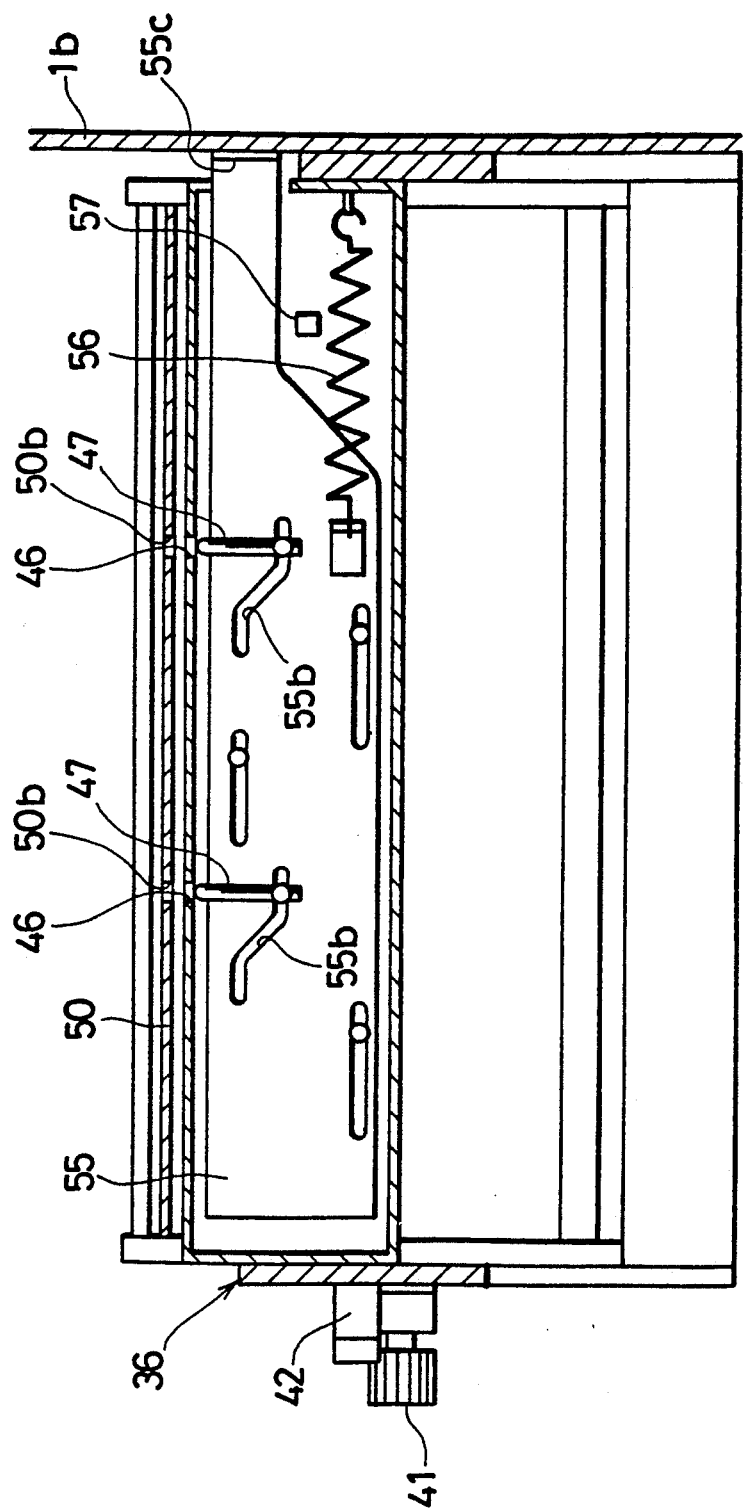
FIG. 7(a) is a vertical cross-sectional view illustrating the internal structure of the positioning device when the fastening pins are in an immerged state.
Figure 7B:
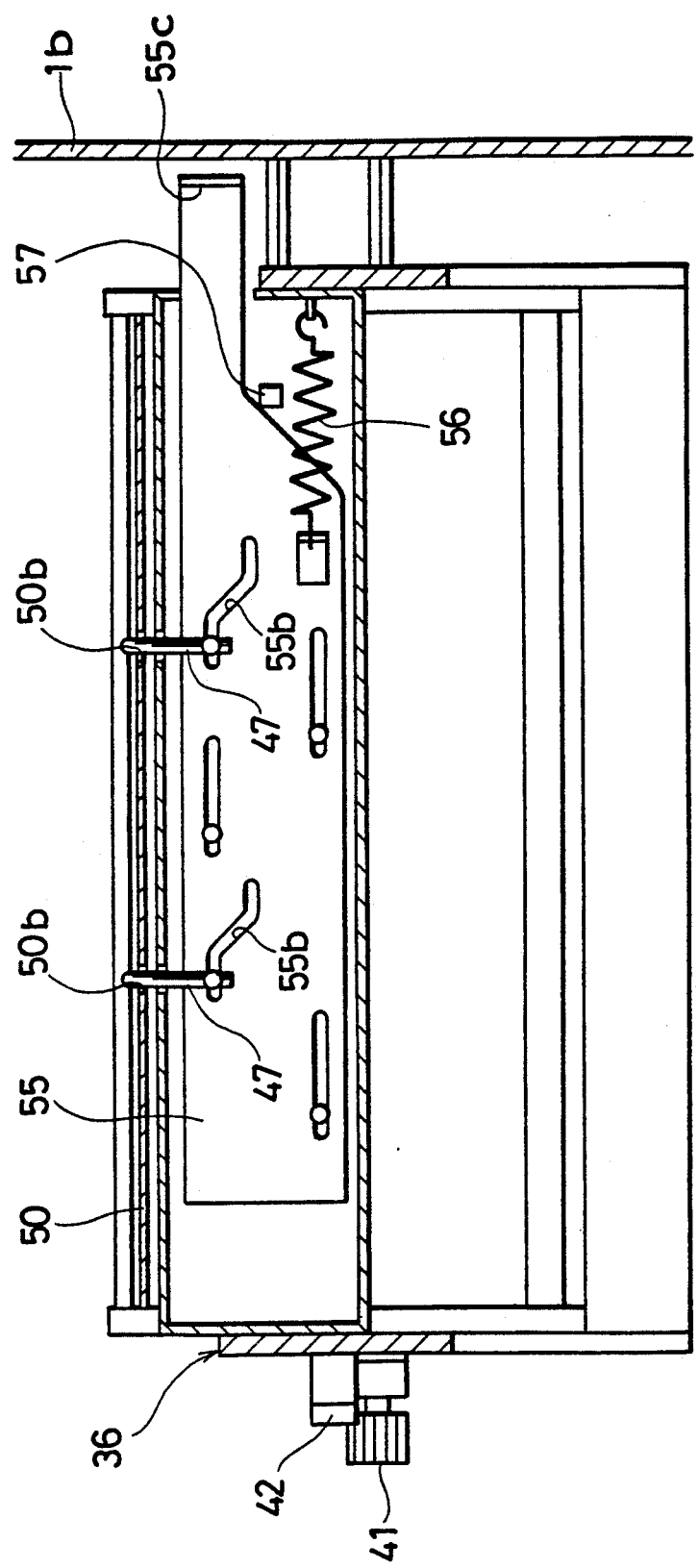
FIG. 7(b) is a vertical cross-sectional view illustrating the internal structure of the positioning device when the fastening pins are in a protruding state.
Figure 8:
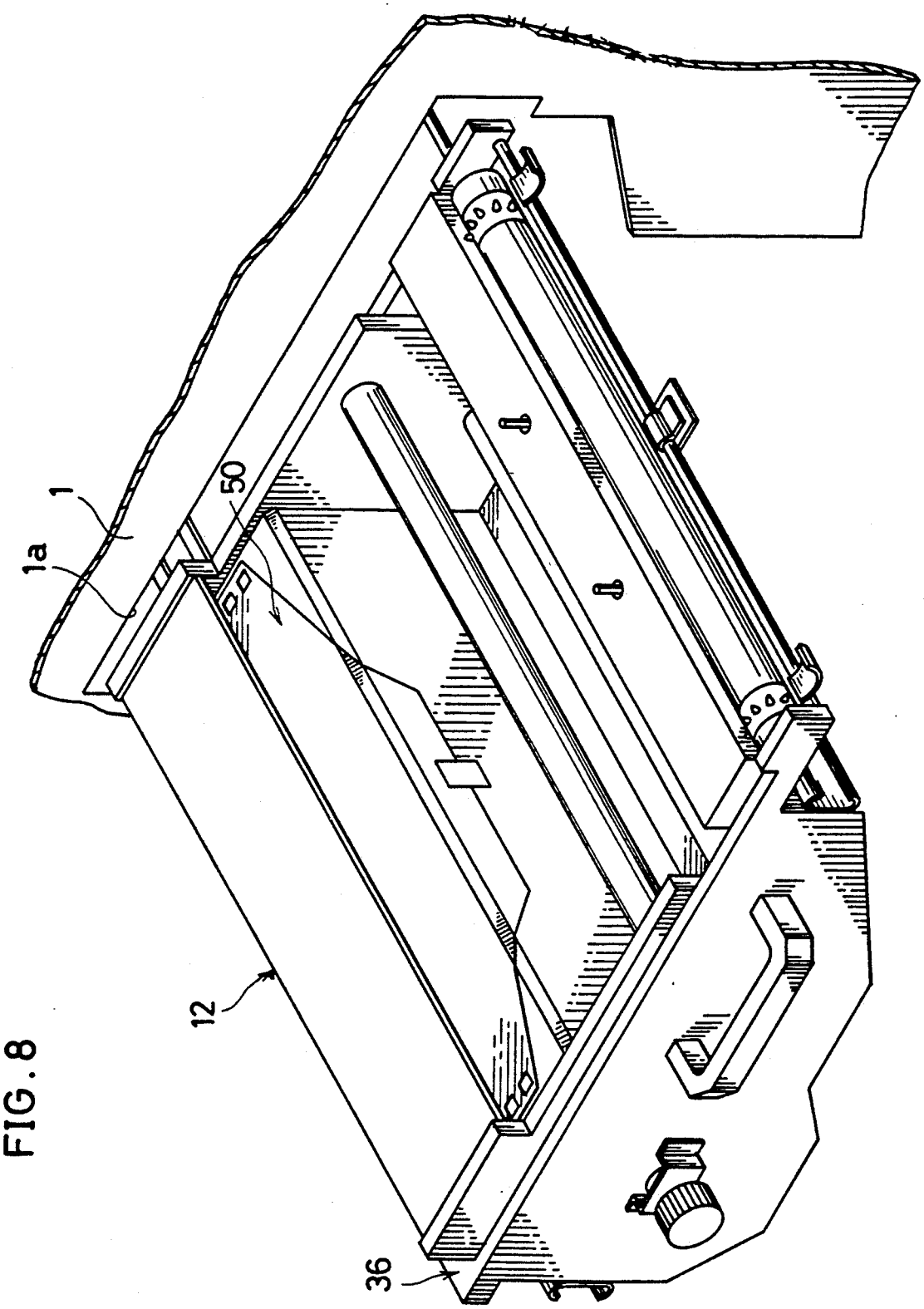
Figure 9:
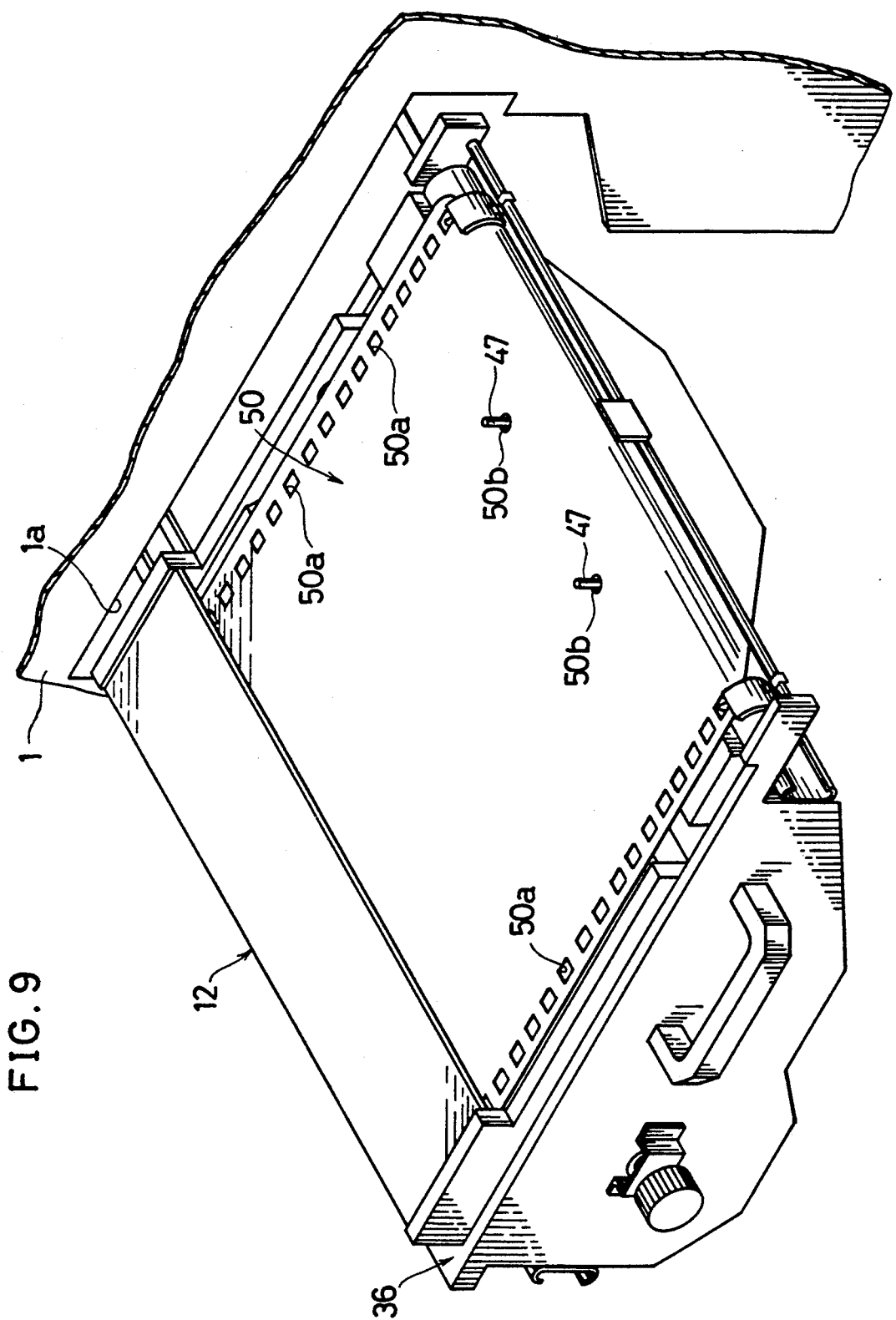
Figure 10:
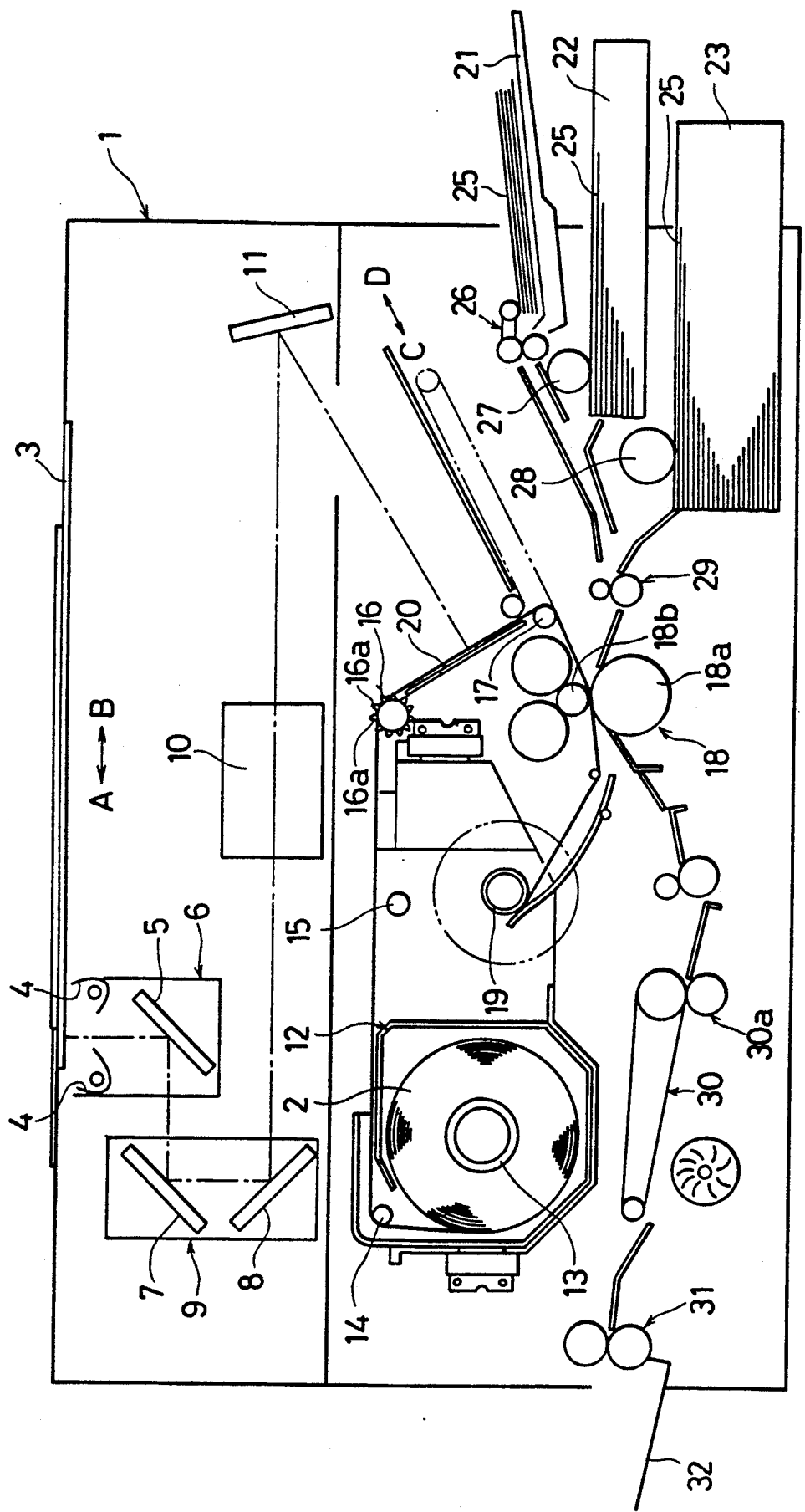
FIG. 10 is a schematic front view illustrating the internal configuration of a conventional copying machine.

As illustrated in FIG. 7(a) and FIG. 7(b), in the positioning device 35 of the present embodiment, a slide plate 55 moves in connection with the bucket 36 when the bucket 36 is pushed in or pulled out, and the fastening pins 47 are driven to emerge and immerge according to this motion. Namely, a handle such as the one described in the previous embodiment is not formed on the slide plate 55, but instead a contact portion 55c formed somewhat narrower, is provided in the rear portion of the slide plate 55 so as to pierce the rear wall of the basket portion 35a and provision is made so that it is able to contact the rear wall lb of the copying machine 1. Also, between the rear wall of the basket portion 35a and a prescribed section of the slide plate 55 there is installed a helical spring 56, and a stopper 57 is fixed on a lateral wall of the basket portion 35a. The stopper 57 is located a little short of the position where the helical spring 56 adopts its natural extension length, and comes in contact with the slide plate 55, so as to restrict the motion of the aforementioned slide plate 55. When the slide plate 55 hits the stopper 57, the contact portion 55c of the slide plate 55 protrudes from the basket portion 35a, the rear edge of the fastening pins 47 consequently rise to the upper horizontal portion of the bent guide slits 55b causing the fastening pins 47 to protrude from the surface of the basket portion 35a. Meanwhile, when the contact portion 55c of the slide plate 55c hits the rear wall 1b causing the slide plate 55 to resist to the force of the helical spring 56 and to be pushed inside the basket portion 35a, the rear edge of the fastening pins 47 are positioned at the lower horizontal portion of the bent guide slits 55b and the fastening pins 47 plunge inside the basket portion 35a.

Figure 6:
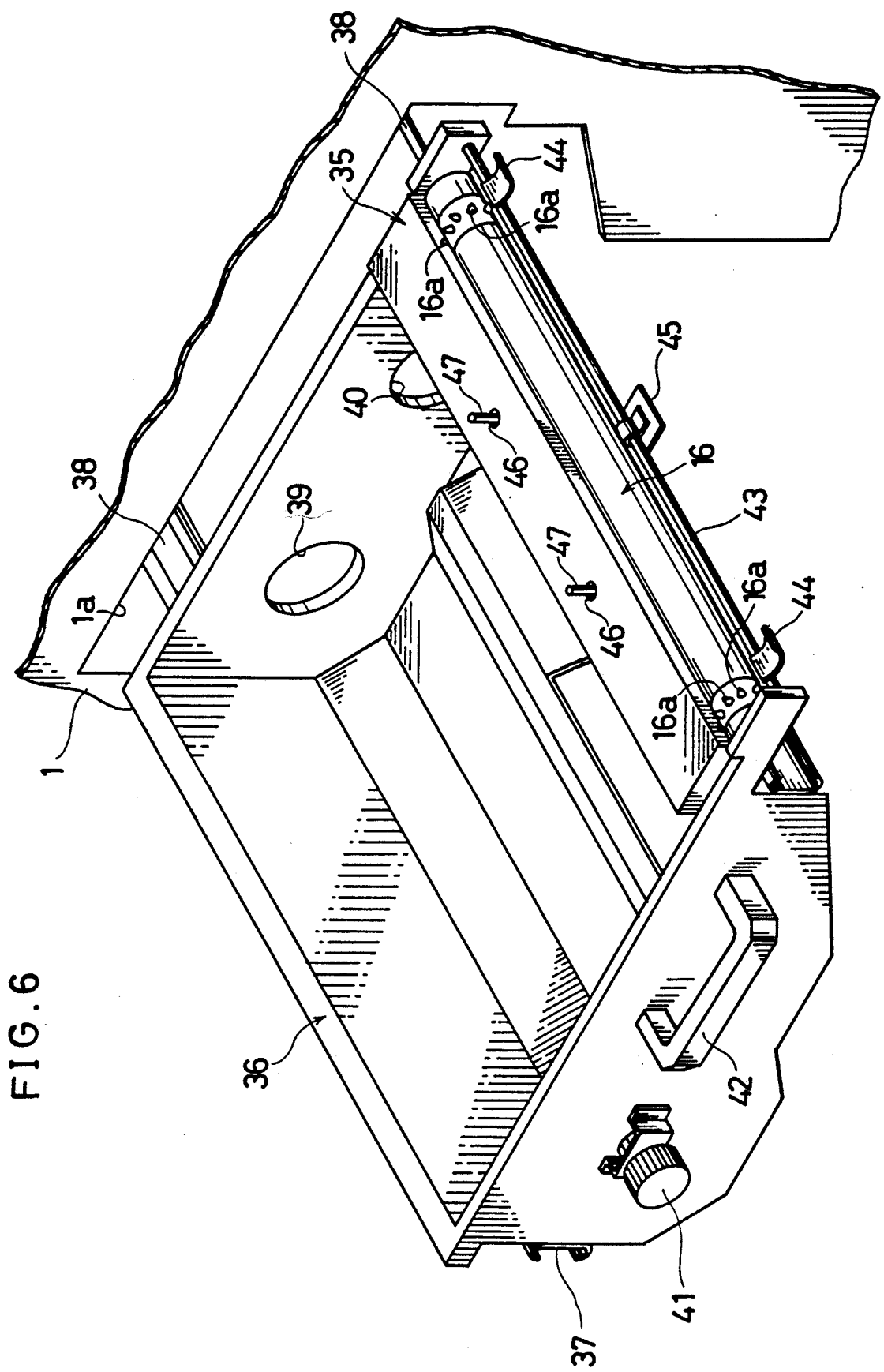

As illustrated in FIG. 6, according to the arrangement described above, when the operator draws the bucket 36 out of the copying machine 1, the fastening pins 47 subsequently protrude from the basket portion 35a. The following loading operation of the cartridge 12 into the bucket 36 and winding operation of the leader sheet 50 may be then performed easily and quickly in the same manner as in the embodiment described earlier, as illustrated in FIG. 8 and FIG. 9. After the winding operation of the leader sheet 50 as described above is completed, by simply pushing the bucket 36 inside the copying machine 1, the slide plate 55 moves, pushed by the rear wall 1b a little before the bucket 36 is completely pushed inside the copying machine The fastening pins 47 consequently immerge and are removed from the fastening holes 50b, and the subsequent transport of the leader sheet 50 and the photosensitive sheet 2 may be performed.

As described above, a photosensitive sheet positioning device in accordance with the present invention, used in an image forming apparatus that controls the transport direction of a photosensitive sheet wound in a roll by fitting successively forwarding holes formed in a line on the sides of a leader sheet attached to the forefront portion of the photosensitive sheet, on forwarding pins formed and protruding on the outer circumference of a roller, performs the positioning of the aforementioned leader sheet during the initial loading operation of the photosensitive sheet, and is characterized in that beside the aforementioned forwarding holes the above-mentioned leader sheet has fastening holes formed thereon, and in that it is mounted with fastening pins which restrain the motion of the above-mentioned leader sheet and which may be freely inserted in and removed from the above-mentioned fastening holes.

As a result, the forwarding holes may be fitted on the forwarding pins easily and rapidly, and may be prevented from being fitted on the forwarding pins in a shifted manner. Difficulties such as the slantwise transport of the photosensitive sheet, the loosening of one side of the photosensitive sheet, and the like may be thereby overcome.

The invention being thus described, it may be obvious that the same may be varied in many ways. Such variations are not to be regarded as a departure from the scope of the invention.

There are described above novel features which the skilled man will appreciate give rise to advantages. These are each independent aspects of the invention to be covered by the present application, irrespective of whether or not they are included within the scope of the following claims.

What is claimed is:

1. A photosensitive sheet positioning device used in an image forming apparatus provided with a removable photosensitive sheet unit having a front side wall and a rear side wall and capable of containing a photosensitive sheet wound in a roll, a leader sheet attached to a leading edge of the photosensitive sheet, forwarding holes formed in a line inward from each of the longitudinal sides of the leader sheet, and a forwarding roller having a portion near each end, each of the portions having an outer circumferential surface from which forwarding pins radially protrude, the forwarding pins being successively fitted into the forwarding holes to control the forwarding direction of the photosensitive sheet, comprising:
   fastening holes formed on a forefront portion of the leader sheet spaced from said forwarding holes toward a center of said leader sheet; and a fastening pin assembly operatively mounted between said roll of said photosensitive sheet and said forwarding roller to restrict the motion of the leader sheet by selectively engaging said fastening holes.

2. A photosensitive sheet positioning device as defined in claim 1, wherein said assembly is mounted on the unit between the front side wall and the rear side wall transverse to the direction of unwinding of the roll of the photosensitive sheet, said assembly having spaced-apart holes formed through an upper surface, a slide plate mounted substantially inside said assembly, said slide plate movable in the longitudinal direction of said assembly, and fastening pins being movable a substantially perpendicular to said upper surface to emerge and immerge through said fastening holes.

3. A photosensitive sheet positioning device as defined in claim 2, wherein said slide plate includes:
   a handle formed at a first end of said slide plate, said first end being adjacent to a front wall of said assembly, said front end being adjacent to the front side wall of the unit, and extending from inside said assembly through said front wall to outside said assembly;
   at least one guide slit, each said guide slit being disposed substantially in the longitudinal direction of said slide plate;
   a plurality of bent guide slits formed in said slide plate including an upper horizontal portion, a lower horizontal portion, and a declining oblique portion connecting said upper horizontal portion and said lower horizontal portion; and
   guide protrusions formed on and extending from an internal longitudinal wall surface of said assembly to engage in said guide slits, such that the motion direction of said slide plate is restricted to the longitudinal direction; and
   wherein a rear edge of each of said fastening pins is engaged in one of said bent guide slits;
   whereby said fastening pins move downward to below said upper surface when said handle is pulled outward from said assembly, and move upward to above said upper surface when said handle is pushed into said assembly.

4. A photosensitive sheet positioning device as defined in claim 2, wherein said slide plate includes guide slits formed on said slide plate, and wherein said assembly further includes guide protrusions formed on an internal wall of said assembly to engage in said guide slits, such that
   the motion direction of said slide plate is restricted to the longitudinal direction of said assembly.

5. A photosensitive sheet positioning device as defined in claim 2, comprising:
   a contact portion formed at a second end of said slide plate, said second end being adjacent to a rear wall of said assembly, said rear wall being adjacent to a rear wall of the image forming apparatus, and extending from inside said assembly through said rear wall to outside said assembly;

a plurality of bent guide slits formed in said slide plate including an upper horizontal portion, a lower horizontal portion, and a declining oblique portion connecting said upper horizontal portion and said lower horizontal portion;

a helical spring installed between said rear wall of said assembly and a connection portion of said slide plate; and a stopper mounted on an internal longitudinal wall surface of said assembly capable of restricting the motion of said slide plate in the longitudinal direction, the length of said spring, when said slide plate is in contact with said stopper, being slightly less than the natural extension length of said spring, being arranged such that a rear edge of each of said fastening pins is engaged in one of said bent guide slits, said fastening pins protrude from said fastening holes of said assembly when said contact portion is protruding from said assembly and not in contact with the rear wall of the image forming apparatus, and said fastening pins move downward into said assembly when said contact portion is in contact with the rear wall of the image forming apparatus, and said slide plate is pushed into said assembly.

6. A method for loading a photosensitive sheet into an image forming apparatus comprising the steps of:

removing a photosensitive sheet unit from said image forming apparatus and installing a cartridge containing said photosensitive sheet wound in a roll inside said unit, pushing a slide plate inward into a fastening pins assembly having multiple fastening pins to cause said fastening pins to provide from said assembly, playing out a leader sheet attached to a leading edge of said photosensitive sheet, said leader sheet having forward holes provided in a line inward from each side and fastening holes provided at a forefront portion between said lines of said forwarding holes, inserting said fastening pins into said fastening holes, and fitting said forwarding holes on forwarding pins radially protruding from the outer circumferential surface of a roller, winding said photosensitive sheet around said roller, and immerging said fastening pins inside said assembly by pulling outward on said slide plate from said assembly to remove said fastening pins from said fastening holes, and installing said unit inside said image forming apparatus.

* * * * *